US012775562B2

(12) United States Patent

Bell et al.

(10) Patent No.: US 12,775,562 B2

(45) **Date of Patent: *Oct. 27, 2026**

(54) MEMORY WITH IMPROVED COMMAND/ADDRESS BUS UTILIZATION

(71) Applicant: Lodestar Licensing Group LLC, Evanston, IL (US)

(72) Inventors: Debra M. Bell, Boise, ID (US); Vaughn N. Johnson, Boise, ID (US); Kyle Alexander, Boise, ID (US); Gary L. Howe, Allen, TX (US); Brian T. Pecha, Boise, ID (US); Miles S. Wiscombe, Boise, ID (US)

( * ) Notice: Subject to any disclaimer, the term of this patent is extended or adjusted under 35 U.S.C. 154(b) by 232 days.

This patent is subject to a terminal disclaimer.

(21) Appl. No.: 18/601,725

(22) Filed: Mar. 11, 2024

(65) Prior Publication Data

US 2024/0281387 A1 Aug. 22, 2024

Related U.S. Application Data

(63) Continuation of application No. 17/882,550, filed on Aug. 6, 2022, now Pat. No. 11,934,326, which is a (Continued)

(51) Int. Cl.

| | |
|---|---|
| ***G06F 13/16*** | (2006.01) |
| ***G11C 11/406*** | (2006.01) |
| ***G11C 11/4096*** | (2006.01) |

(52) U.S. Cl.

CPC .... *G06F 13/1668* (2013.01); *G11C 11/40611* (2013.01); *G11C 11/40618* (2013.01); *G11C 11/4096* (2013.01)

(58) Field of Classification Search

CPC .. G06F 13/1668; G06F 3/0658; G06F 3/0659; G06F 3/0683; G11C 11/40611; (Continued)

(56) References Cited

U.S. PATENT DOCUMENTS

| | | | |
|---|---|---|---|
| 10,600,470 B2 | 3/2020 | Bang | |
| 11,409,674 B2 | 8/2022 | Bell et al. | |

(Continued)

FOREIGN PATENT DOCUMENTS

| | | | | |
|---|---|---|---|---|
| CN | 111158585 A | * | 5/2020 | ........... G06F 3/0673 |
| CN | 111326187 A | | 6/2020 | |
| JP | 2006-269029 A | | 10/2006 | |

OTHER PUBLICATIONS

Chinese patent office, "China Office Action," issued in connection with China Patent Application No. 202111141719.3 dated May 7, 2025 (13 pages) (5 pages of English Translation and 8 pages of Original Document).

*Primary Examiner* — Fernando Hidalgo

(57) ABSTRACT

Memory devices and systems with improved command/address bus utilization are disclosed herein. In one embodiment, a memory device comprises a plurality of external command/address terminals and a command decoder. The plurality of external command/address terminals are configured to receive a command as a corresponding plurality of command/address bits. A first set of the command/address bits indicate a read or write operation. A second set of the command/address bits indicate whether to execute a refresh operation. The memory device is configured to, in response to the first set of command/address bits, execute the read or write operation on a portion of a memory array. The memory device is further configured to, in response to the second set of command/address bits, execute the refresh operation to refresh at least one memory bank of the memory array when the second set of command/address bits indicate that the refresh operation should be executed.

20 Claims, 5 Drawing Sheets

Related U.S. Application Data continuation of application No. 17/062,484, filed on Oct. 2, 2020, now Pat. No. 11,409,674.

(58) Field of Classification Search
CPC .......... G11C 11/40618; G11C 11/4096; G11C 11/40603; G11C 11/40615; G11C 11/408; G11C 11/409
USPC .......................................................... 711/106
See application file for complete search history.

(56) References Cited

U.S. PATENT DOCUMENTS

| | | | | |
|---|---|---|---|---|
| 2011/0007593 | A1* | 1/2011 | Takano | G11C 11/406 365/230.03 |
| 2015/0043292 | A1 | 2/2015 | Lee et al. | |
| 2018/0114580 | A1* | 4/2018 | Alrod | G11C 16/349 |
| 2018/0314635 | A1* | 11/2018 | Alam | G11C 16/22 |
| 2019/0205244 | A1* | 7/2019 | Smith | G06F 3/065 |
| 2019/0369915 | A1* | 12/2019 | Prather | G11C 7/1057 |
| 2019/0369923 | A1* | 12/2019 | Prather | G06F 13/1689 |
| 2020/0194054 | A1 | 6/2020 | Kaminski et al. | |
| 2020/0356305 | A1 | 11/2020 | Kim et al. | |
| 2021/0263684 | A1 | 8/2021 | Das et al. | |
| 2021/0263866 | A1 | 8/2021 | Norman et al. | |
| 2021/0311634 | A1 | 10/2021 | Chang et al. | |
| 2022/0050794 | A1* | 2/2022 | Lin | G06F 13/1642 |
| 2022/0083253 | A1* | 3/2022 | Kwon | G11C 11/5671 |
| 2022/0107905 | A1 | 4/2022 | Bell et al. | |
| 2022/0405019 | A1 | 12/2022 | Song | |

* cited by examiner

MEMORY WITH IMPROVED COMMAND/ADDRESS BUS UTILIZATION

CROSS-REFERENCE TO RELATED APPLICATION(S)

This application is a continuation of U.S. patent application Ser. No. 17/882,550, filed Aug. 6, 2022, which is a continuation of U.S. patent application Ser. No. 17/062,484, filed Oct. 2, 2020, each of which is incorporated herein by reference in its entirety.

TECHNICAL FIELD

The present disclosure is related to memory systems, devices, and associated methods. In particular, the present disclosure is related to memory devices with improved command/address bus utilization.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Figure 1:
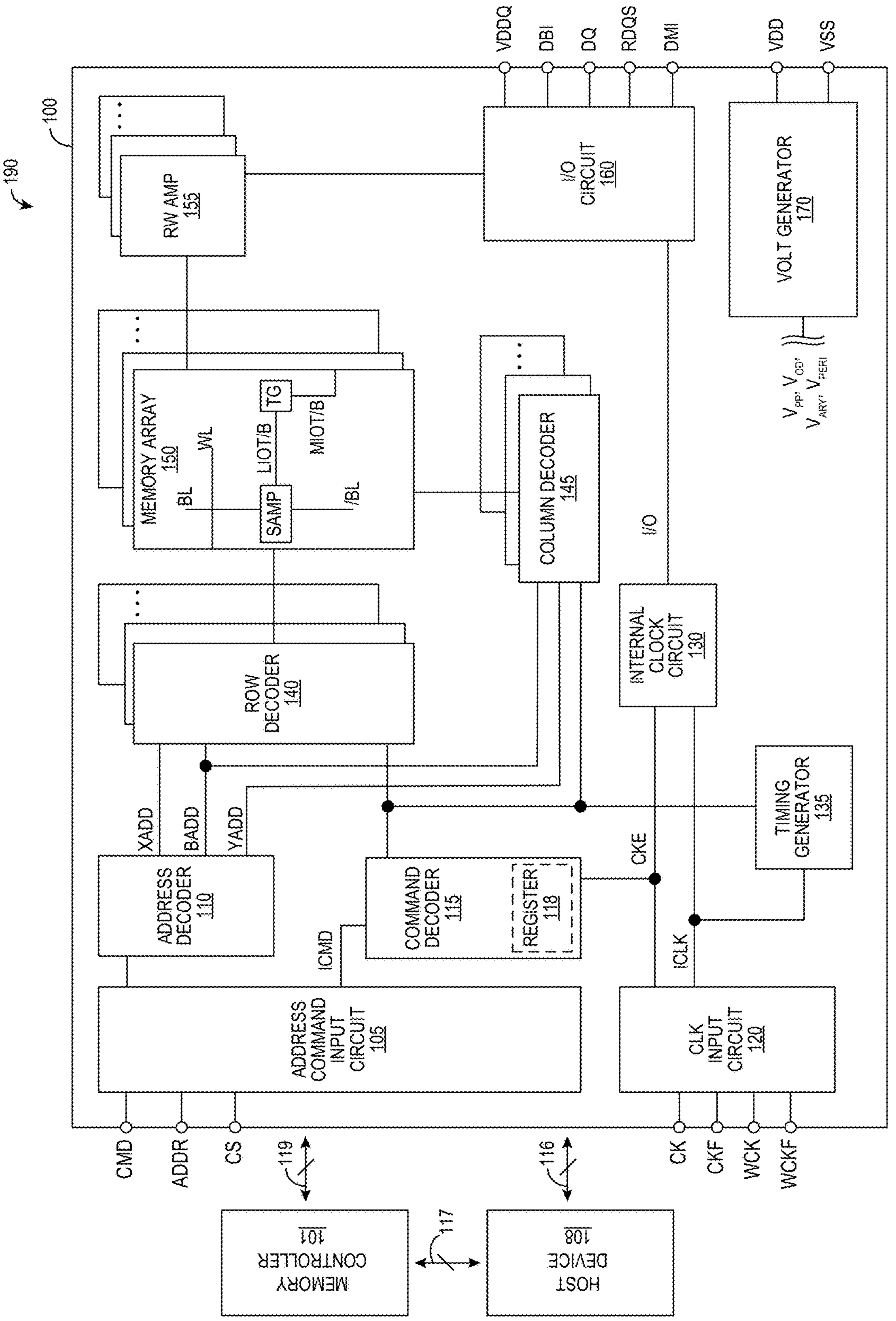
FIG. 1 is a block diagram schematically illustrating a memory system configured in accordance with various embodiments of the present technology.

Memory devices, such as DRAM devices, utilize refresh operations to keep data from being corrupted by, for example, charge leakage or other effects that can degrade data over time. Often, the memory devices perform refresh operations in response to receiving a refresh command (e.g., from a memory controller and/or from a host device). One such refresh command is a refresh all banks command (REFab). In response to receiving a refresh all banks command (REFab), a memory device proceeds to perform several refresh operations to refresh all of the memory banks of its memory array over a time period tRFC1. Because all of the memory banks of the memory array are refreshed in response to receiving the refresh all banks command (REFab), the memory device locks the entire memory array for the entire duration of the time period tRFC1, meaning that memory banks of the memory device are not accessible for reading or writing data and/or for other operations during the time period tRFC1. Thus, the total time the memory array of the memory device is available for reading and writing data is reduced whenever a refresh all banks command (REFab) is received and executed by the memory device.

In some embodiments, refresh single bank commands (REFsb) can be used in lieu of refresh all banks commands (REFab). In response to receiving a refresh single bank command (REFsb), the memory device proceeds to perform one or more refresh operations (e.g., an auto refresh operation and/or row hammer refresh operations) on only one memory bank of the memory array (e.g., on a memory bank specified in the refresh single bank command (REFsb) or by a counter of the memory device). Thus, the memory device locks only the one memory bank for a time period tRFCsb, which is shorter than the time period tRFC1 of a refresh all banks command (REFab). In addition, the other memory banks of the memory array remain unlocked and available for reading or writing data and/or for other operations while the memory device executes the refresh single bank command (REFsb).

That said, multiple refresh single bank commands (REFsb) are required to refresh every memory bank of the memory array. For example, sixteen refresh single bank commands (REFsb) are required to refresh a memory array including sixteen memory banks in total. Thus, using refresh single bank commands (REFsb) to refresh every memory bank of a memory array consumes more command/address bus bandwidth than using a single refresh all banks command (REFab).

Memory devices and systems of the present technology address this concern by embedding refresh single bank commands (REFsb) and/or other refresh commands into one or more other commands (e.g., read, write, and/or other commands) issued to and/or received by the memory device. For example, a refresh single bank command (REFsb) can be issued to a memory device following a read or write command. Continuing with this example, a command/address bit of the read or write commands can be used in some embodiments to instruct a memory device whether to execute refresh single bank commands (REFsb) and/or other refresh commands following execution of the read or write commands. In this manner, the memory systems of the present technology can issue and/or the memory devices of the present technology can receive refresh commands with minimal and/or reduced consumption of command/address bus bandwidth by embedding the refresh commands into other commands transmitted over the command/address bus.

A person skilled in the art will understand that the technology may have additional embodiments and that the technology may be practiced without several of the details of the embodiments described below with reference to FIGS. 1-8. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

As used herein, the term "refresh" refers to various maintenance operations that can be performed on one or more memory cells of memory devices configured in accordance with various embodiments of the present technology. In some embodiments, the term "refresh" can refer to maintenance operations performed on one or more memory cells to maintain their data. For example, in the context of DRAM and other memory devices, the term "refresh" can refer to reading data from the one or more memory cells and rewriting the data to the one or more memory cells to increase the charge stored on the one or more memory cells to ameliorate charge leakage and to prevent data loss. In these and other embodiments, the term "refresh" can refer to reading data from the one or more memory cells and rewriting the data to the one or more memory cells in an inverted or other data state (e.g., from high to low or low to high), to ameliorate hysteresis shift, material depolarization, imprint and/or wear effects, or the like. In these and still other embodiments, the term "refresh" can refer to other maintenance operations, such as reading data from one or more memory cells and rewriting the data to one or more memory cells at another/other memory location(s).

In the illustrated embodiments below, the memory devices and systems are, for the sake of clarity and understanding, primarily described in the context of embedding refresh single bank commands (REFsb) into other commands issued to and/or received by a memory device. The disclosure, however, is not so limited. A person of ordinary skill in the art will recognize that all or a subset of the technology disclosed herein can be implemented in the context of embedding other refresh commands (e.g., refresh all bank commands (REFab), fine granular refresh commands, and/or other refresh commands) into other commands issued to and/or received by a memory device and that such implementations fall within the scope of the present technology.

FIG. 1 is a block diagram schematically illustrating a memory system 190 configured in accordance with various embodiments of the present technology. The memory system 190 can include a memory device 100 (e.g., an individual memory die, a plurality of memory dies, etc.) that can be connected to any one of a number of electronic devices that is capable of utilizing memory for the temporary or persistent storage of information, or a component thereof. For example, the memory device 100 can be operably connected to memory controller 101 (via an interface 119) and/or to a host device 108 (e.g., via an interface 116 and/or via the memory controller 101 and an interface 117). The host device 108 operably connected to the memory device 100 may be a computing device such as a desktop or portable computer, a server, a hand-held device (e.g., a mobile phone, a tablet, a digital reader, a digital media player), or some component thereof (e.g., a central processing unit, a coprocessor, a dedicated memory controller, etc.). The host device 108 may be a networking device (e.g., a switch, a router, etc.) or a recorder of digital images, audio, and/or video; a vehicle; an appliance; a toy; or any one of a number of other products. In one embodiment, the host device 108 may be connected directly to the memory device 100, although in other embodiments, the host device 108 may be indirectly connected to the memory device 100 (e.g., over a networked connection or through intermediary devices, such as through the memory controller 101).

The memory device 100 can receive a plurality of signals (e.g., from the memory controller 101 and/or from the host device 108). In this regard, the memory device 100 may employ a plurality of external terminals that include command and address terminals coupled to a command/address bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, and power supply terminals VDD, VSS, and VDDQ.

The power supply terminals of the memory device 100 may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in a row decoder 140, the internal potentials VOD and VARY can be used in sense amplifiers included in a memory array 150 of the memory device 100, and the internal potential VPERI can be used in many other circuit blocks.

The power supply terminals may also be supplied with power supply potential VDDQ. The power supply potential VDDQ can be supplied to an input/output (IO) circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology.

However, the dedicated power supply potential VDDQ can be used for the IO circuit 160 so that power supply noise generated by the IO circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from a command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from the command decoder 115. For example, the internal clock circuit 130 can include a clock path (not shown in FIG. 1) that receives the internal clock signal ICLK and provides various clock signals (not shown) to the command decoder 115. The internal clock circuit 130 can further provide input/output (IO) clock signals. The IO clock signals can be supplied to the IO circuit 160 and can be used as a timing signal for determining an output timing of read data and the input timing of write data. The IO clock signals can be provided at multiple clock frequencies so that data can be output from and input into the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated that can be used by the command decoder 115, the column decoder 145, and/or other components of the memory device 100.

The memory device 100 may include an array of memory cells, such as memory array 150. The memory cells of the memory array 150 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be one or more memory banks or another arrangement of memory cells (e.g., half memory banks, subarrays in a memory bank, etc.). In these and other embodiments, the memory regions of the memory array 150 can be arranged in one or more groups (e.g., one or more groups of memory banks, one or more logical memory ranks or dies, etc.). Memory cells in the memory array 150 can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The command terminals and address terminals may be supplied with an address signal and a bank address signal from outside the memory device 100 (e.g., from the memory controller 101 and/or from the host device 108) over a command bus and an address bus, respectively, (e.g., over the interfaces 116, 117, and/or 119). The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also extract a bank address signal (BADD) and supply it to both the row decoder 140 and the column decoder 145.

The command and address terminals can be supplied with command signals CMD, address signals ADDR, and chip selection signals CS (e.g., from the memory controller 101 and/or the host device 108). The command signals may represent various memory commands (e.g., including access commands, which can include read commands and write commands, and refresh commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK (not shown) to the command decoder 115.

The command decoder 115 may further include one or more registers 118 for tracking various counts or values (e.g., counts of refresh commands received by the memory device 100 or self-refresh operations performed by the memory device 100) and/or for storing various operating conditions for the memory device 100 to perform certain functions, features, and modes (refresh modes, test modes, etc.). As such, in some embodiments, registers 118 (or a subset of the registers 118) may be referred to as mode registers. For example, the memory device 100 may be placed into a refresh mode by programming certain bits of the registers 118.

When a read command is issued, and a row address and a column address are timely supplied with the read command, read data can be read from memory cells in the memory array 150 designated by these row address and column address. The read command may be received by the command decoder 115, which can provide internal commands to the IO circuit 160 so that read data can be output from the data terminals DQ, RDQS, DBI, and DMI via read/write (RW) amplifiers 155 and the IO circuit 160 according to the RDQS clock signals. The read data may be provided at a time defined by read latency information RL that can be programmed in the memory device 100, for example, in a mode register 118. The read latency information RL can be defined in terms of clock cycles of the CK clock signal. For example, the read latency information RL can be a number of clock cycles of the CK signal after the read command is received by the memory device 100 when the associated read data is provided.

When a write command is issued, and a row address and a column address are timely supplied with the command, write data can be supplied to the data terminals DQ, DBI, and DMI according to the WCK and WCKF clock signals. The write command may be received by the command decoder 115, which can provide internal commands to the IO circuit 160 so that the write data can be received by data receivers in the IO circuit 160, and supplied via the IO circuit 160 and the RW amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register 118. The write latency WL information can be defined in terms of clock cycles of the CK clock signal. For example, the write latency information WL can be a number of clock cycles of the CK signal after the write command is received by the memory device 100 when the associated write data is received.

The memory array 150 may be refreshed or maintained as described herein to prevent data loss, either due to charge leakage or imprint effects. A refresh operation, as described herein, may be initiated by the memory system 190 (e.g., by the host device 108, the memory controller 101, and/or the memory device 100), and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory device 100 may be configured to refresh the same row of memory cells in every memory bank of the memory array 150 simultaneously. In another approach, the memory device 100 may be configured to refresh the same row of memory cells in every memory bank of the memory array 150 sequentially. In still another approach, the memory device 100 can further include circuitry (e.g., one or more registers, latches, embedded memories, counters, etc.) configured to track row (e.g., word line) addresses, each corresponding to one of the memory banks in the memory array 150. In this approach, the memory device 100 is not constrained to refresh the same row in each memory bank of the memory array 150 before refreshing another row in one of the memory banks.

Regardless of the refresh approach, the memory device 100 can be configured to refresh memory cells in the memory array 150 within a given refresh rate or time window (e.g., 32 ms, 28 ms, 25 ms, 23 ms, 21 ms, 18 ms, 16 ms, 8 ms, etc.), known as tREF. In these embodiments, the memory system 190 (e.g., the memory controller 101, the host device 108, and/or the memory device 100) can be configured to supply refresh commands to the memory device 100 in accordance with a specified minimum cadence tREFI. For example, the memory system 190 can be configured to supply one or more refresh commands to the memory device 100 at least every 7.8 s such that an approximate minimum of 4000 refresh commands are supplied to the memory device 100 within a 32 ms time window.

Figure 2A:
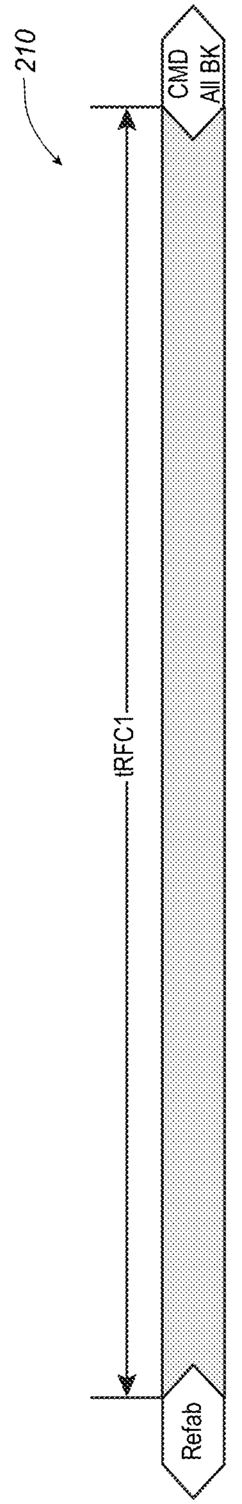
FIG. 2A is a timing diagram of a refresh all banks command (REFab) in accordance with various embodiments of the present technology.

As explained above, one example of a refresh command is a refresh all banks command (REFab). In response to receiving a refresh all banks command (REFab), the memory device 100 performs several refresh operations (e.g., one or more auto refresh operations and/or one or more row hammer refresh (RHR) operations) to refresh all of the memory banks of the memory array 150. FIG. 2A is a timing diagram 210 of commands sent to and/or received by the memory device 100 over the command/address bus in accordance with various embodiments of the present technology. In particular, FIG. 2A illustrates that the memory device 100 locks the entire memory array 150 for a time period tRFC1 when the memory device 100 receives a refresh all banks command (REFab). In other words, when the memory device 100 receives a refresh all banks command (REFab), none of the memory banks of the memory array 150 are available for reading or writing data and/or for other operations until the time period tRFC1 has elapsed. Thus, the total time the memory array 150 of the memory device 100 is available for reading and writing data and/or for other operations is reduced whenever a refresh all banks command (REFab) is received and executed by the memory device 100. After the time period tRFC1 has elapsed, the memory device 100 unlocks the memory array 150 and can proceed to receive and/or execute other commands CMD All BK on any of the memory banks of the memory array 150.

Figure 2B:
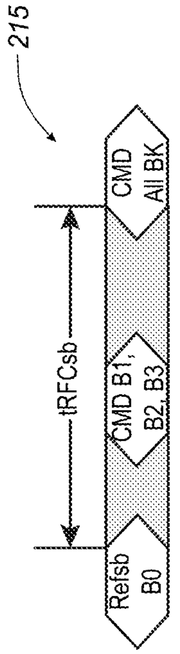
FIG. 2B is a timing diagram of a refresh single bank command (REFsb) in accordance with various embodiments of the present technology.

Another example of a refresh command is a refresh single bank command (REFsb). In response to receiving a refresh single bank command (REFsb), the memory device 100 performs one or more refresh operations (e.g., one or more auto refresh operations and/or one or more RHR operations) on only one memory bank of the memory array 150 (e.g., on a memory bank specified in the refresh single bank command (REFsb) or by a counter of the memory device 100). FIG. 2B is a timing diagram 215 of commands sent to and/or received by the memory device 100 over the command/address bus in accordance with various embodiments of the present technology. In particular, FIG. 2B illustrates that the memory device 100 receives a refresh single bank command (REFsb B0), in response to which the memory device 100 locks a memory bank B0 of the memory array 150 for a time period tRFCsb and proceeds to perform one or more refresh operations on only the memory bank B0 before the time period tRFCsb expires. As shown, the time period tRFCsb is significantly shorter in duration than the time period tRFC1 of FIG. 2A. In addition, other memory banks (e.g., memory banks B1, B2, and B3) of the memory array 150 remain unlocked (e.g., available for reading or writing data and/or for other operations), meaning that the memory device 100 can receive and/or execute other commands (e.g., commands CMD B1, B2, B3) on the other memory banks of the memory array 150. After the time period tRFCsb has elapsed, the memory device 100 unlocks the memory bank B0 and can proceed to receive and/or execute other commands CMD All BK on any of the memory banks of the memory array 150.

In some embodiments, refresh single bank commands (REFsb) can be used in addition to or in lieu of refresh all banks commands (REFab) (e.g., to keep at least a portion of the memory array 150 available for reading or writing data and/or for other operations while the memory device 100 refreshes one or more of the memory banks of the memory array 150). That said, multiple refresh single bank commands (REFsb) are required to refresh multiple memory banks of the memory array 150. For example, sixteen refresh single bank commands (REFsb) are required to refresh a memory array including sixteen memory banks in total. Thus, using multiple refresh single bank commands (REFsb) to refresh all or even several memory banks of the memory array 150 can consume more command/address bus bandwidth than a single refresh all banks command (REFab).

Figure 3:
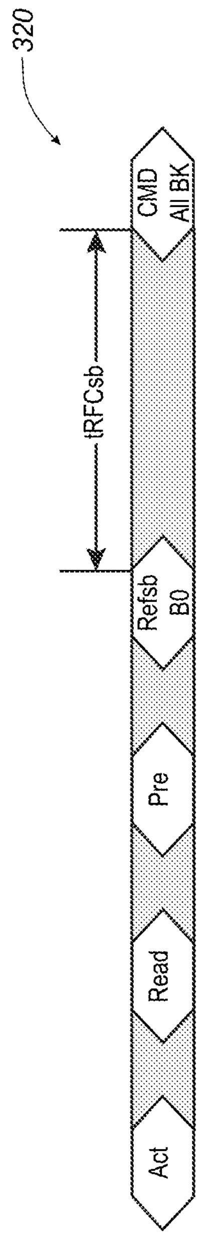
FIG. 3 is a timing diagram illustrating bus utilization when issuing a read command, a precharge command, and a refresh single bank (REFsb) command in accordance with various embodiments of the present technology.

To address this concern, the memory system 190 can embed refresh single bank commands (REFsb) and/or other refresh commands into one or more other commands (e.g., read, write, and/or other commands) issued to and/or received by the memory device 100 over the command/address bus. For example, a refresh single bank command (REFsb) and/or another refresh command can be issued to the memory device 100 following a read command. FIG. 3 is a timing diagram 320 illustrating command/address bus utilization under this example in accordance with various embodiments of the present technology. As shown, an activate command (ACT) is sent to and/or received by the memory device 100, followed by a read command (Read). Once data is read from the memory array 150, a precharge command (Pre) is sent to and/or received by the memory device 100 to precharge all or a portion of the memory array 150 for a refresh operation performed by the memory device 100 in response to receiving a subsequent refresh command, such as a refresh single bank command (REFsb).

Figure 4:
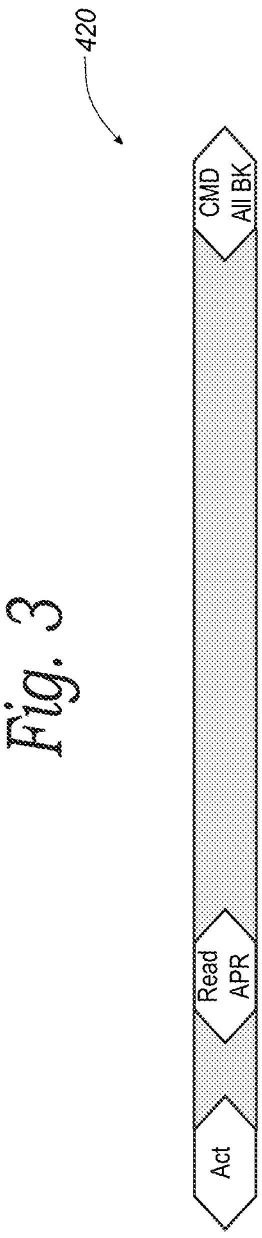
FIG. 4 is a timing diagram illustrating bus utilization when issuing a read auto precharge+refresh command (Read APR) in accordance with various embodiments of the present technology.

FIG. 4 is a timing diagram 420 illustrating command/address bus utilization when a refresh command (e.g., a refresh single bank command (REFsb) or another refresh command) is embedded into a read command (Read) or a read auto precharge command (Read AP) in accordance with various embodiments of the present technology. As shown, an activate command (ACT) is sent to and/or received by the memory device 100, followed by a read auto precharge+refresh command (Read APR). A first set of (e.g., one or more) command/address bits of the read auto precharge+refresh (Read APR) command indicate a read operation and/or a precharge operation, and a second set of (e.g., one or more) command/address bits of the read auto precharge+refresh (Read APR) command indicate a refresh operation. The first set of command/address bits can be the same or different from the second set of command/address bits. In response to the first set of command/address bits of the read auto precharge+refresh command (Read APR), the memory device 100 proceeds to read data from the memory array 150 and/or precharge all or a portion of the memory array 150. In response to the second set of command/address bits of the read auto precharge+refresh command (Read APR), and the memory device 100 proceeds to perform one or more refresh operations on all or the portion of the memory array 150. In other words, assuming that the refresh command embedded into the read auto precharge+refresh command (Read APR) of FIG. 4 is a refresh single bank command (REFsb) directed to memory bank B0 of the memory array 150, the memory device 100 proceeds to perform the same sequence of operations as illustrated in FIG. 3 but with two fewer commands transmitted over the command/address bus. Therefore, by embedding the refresh command (e.g., a refresh single bank command (REFsb) or another refresh command) into a read command (Read) or into a read auto precharge command (Read AP), the memory system 190 reduces the amount of command/address bus bandwidth utilized to refresh one or more memory banks of the memory array 150. In this manner, the memory system 190 can issue (and/or the memory device 100 can receive) refresh single bank commands (REFsb) to refresh memory banks of the memory array 150 while keeping other memory banks of the memory array 150 available for reading or writing data and/or for other operations with minimal and/or reduced consumption of command/address bus bandwidth.

Figure 5:
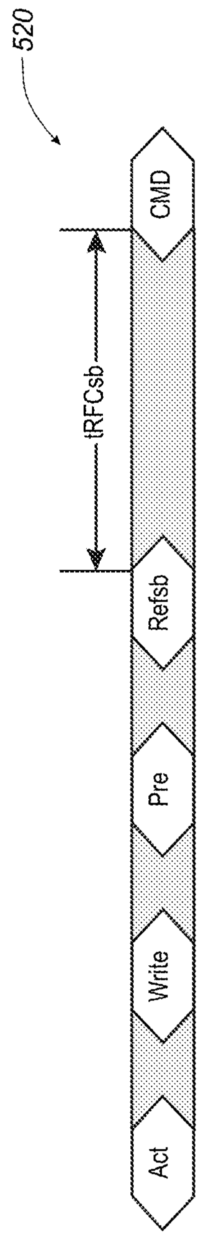
FIG. 5 is a timing diagram illustrating bus utilization when issuing a write command, a precharge command, and a refresh single bank (REFsb) command in accordance with various embodiments of the present technology.

As another example, a refresh single bank command (REFsb) and/or another refresh command can be issued to the memory device 100 following a write command. FIG. 5 is a timing diagram 520 illustrating command/address bus utilization under this example in accordance with various embodiments of the present technology. As shown, an activate command (ACT) is sent to and/or received by the memory device 100, followed by a write command (Write). Once data is written to the memory array 150, a precharge command (Pre) is sent to and/or received by the memory device 100 to precharge all or a portion of the memory array 150 for a refresh operation performed by the memory device 100 in response to receiving a subsequent refresh command, such as a refresh single bank command (REFsb).

Figure 6:
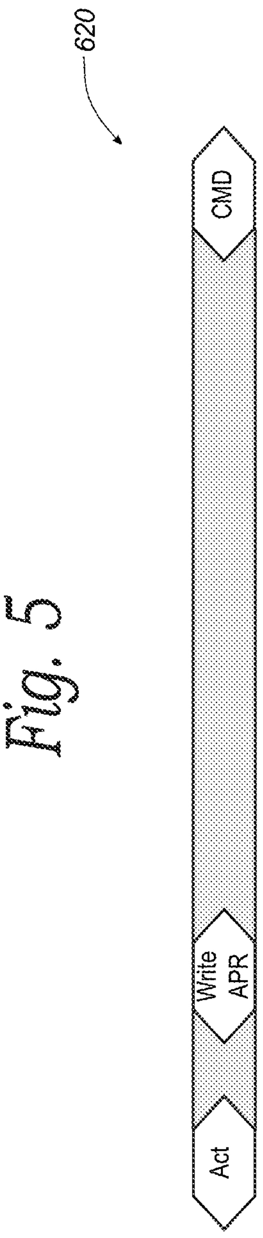
FIG. 6 is a timing diagram illustrating bus utilization when issuing a write auto precharge+refresh command (Write APR) in accordance with various embodiments of the present technology.

FIG. 6 is a timing diagram 620 illustrating command/address bus utilization when a refresh command (e.g., a refresh single bank command (REFsb) or another refresh command) is embedded into a write command (Write) or a write auto precharge command (Write AP) in accordance with various embodiments of the present technology. As shown, an activate command (ACT) is sent to and/or received by the memory device 100, followed by a write auto precharge+refresh command (Write APR). A first set of (e.g., one or more) command/address bits of the write auto precharge+refresh command indicate a write operation and/or a precharge operation, and a second set of (e.g., one or more) command/address bits of the write auto precharge+refresh command (Write APR) indicate a refresh operation. The first set of command/address bits can be the same or different from the second set of command/address bits. In response to the first set of command/address bits of the write auto precharge+refresh command (Write APR), the memory device 100 proceeds to write data to the memory array 150 and/or to precharge all or a portion of the memory array 150. In response to the second set of command/address bits of the write auto precharge+refresh command (Write APR), the memory device 100 proceeds to perform one or more refresh operations on all or the portion of the memory array 150. In other words, assuming that the refresh command embedded into the write auto precharge+refresh command (Write APR) of FIG. 6 is a refresh single bank command (REFsb) directed to memory bank B0 of the memory array 150, the memory device 100 proceeds to perform the same sequence of operations as illustrated in FIG. 5 but with two fewer commands transmitted over the command/address bus. Therefore, by embedding the refresh command (e.g., a refresh single bank command (REFsb) or another refresh command) into a write command (Write) or into a write auto precharge command (Write AP), the memory system 190 reduces the amount of command/address bus bandwidth utilized to refresh one or more memory banks of the memory array 150. In this manner, the memory system 190 can issue (and/or the memory device 100 can receive) refresh single bank commands (REFsb) to refresh memory banks of the memory array 150 while keeping other memory banks of the memory array 150 available for reading or writing data and/or for other operations with minimal and/or reduced consumption of command/address bus bandwidth.

In some embodiments, the memory system 190 can embed refresh commands into other commands using command/address bits of the other commands. For example, one or more command/address bits of read commands (Read), read auto precharge commands (Read AP), write commands (Write), and/or write auto precharge commands (Write AP) can be used to instruct the memory device 100 whether to execute a refresh operation (e.g., a refresh single bank operation and/or another refresh operation) following execution of the read operations (Read), the read operation and precharge operations (Read AP), the write operations (Write), and/or the write operations and precharge operations (Write AP). Table 1 below shows one possibility for embedding refresh commands into other commands using a command/address bit (e.g., command/address bit 12) of the other commands transmitted to and/or received by the memory device 100:

TABLE 1

| Command | Command/Address Bit 12 Value | Resulting Command |
|---|---|---|
| Read | 0 | Read |
| | 1 | Read APR |
| Read AP | 0 | Read AP |
| | 1 | Read APR |
| Write | 0 | Write |
| | 1 | Write APR |
| Write AP | 0 | Write AP |
| | 1 | Write APR |

Referring to Table 1 above as an example, the memory device 100 can monitor the command/address bit 12 of read commands (Read), a read auto precharge commands (Read AP), a write commands (Write), and/or a write auto precharge commands (Write AP) received over the command/address bus. When the command/address bit 12 is asserted, the memory device can execute a refresh command after executing the corresponding read command (Read), the read auto precharge command (Read AP), the write command (Write), and/or a write auto precharge command (Write AP). In other words, the memory device 100 can execute a read auto precharge+refresh command (Read APR) or a write auto precharge+refresh command (Write APR) when the command/address bit 12 is asserted. On the other hand, when the command/address bit 12 is not asserted, the memory device 100 can execute the original command received over the command/address bus (e.g., a read command (Read), a read auto precharge command (Read AP), a write command (Write), and/or a Write auto precharge command (Write AP)).

In some embodiments, the feature described above can be enabled or disabled. As one example, a mode register can be used to enable or disable embedding a refresh command into a read command (READ). When enabled, the memory device 100 can monitor the command/address bit 12 of a read command (READ) to determine whether to perform a refresh operation following execution of a read operation, as described above. When disabled, the memory device 100 can perform only a read operation in response to the read command (READ) regardless of whether the command/address bit 12 is asserted or not.

A person of ordinary skill in the art will recognize that Table 1 above illustrates only four of the possible commands into which the memory system 190 can embed refresh commands. That is, a person of ordinary skill in the art will appreciate that the memory system 190 can embed refresh commands into other commands (e.g., any other command that does not use all of the command/address bits) in addition to or in lieu of read commands (Read), read auto precharge commands (Read AP), write commands (Write), and write auto precharge commands (Write AP). For example, the memory system 190 can embed refresh commands into a precharge command (Pre) and/or into various mode register commands (e.g., mode register read commands, mode register write commands, mode register erase commands, etc.). Such other commands fall within the scope of the present technology.

In addition, a person of ordinary skill in the art will recognize that one or more other command/address bits of other commands in addition to or in lieu of command/address bit 12 as used in the example provided in Table 1 can be used to embed refresh commands into the other commands. Furthermore, a person of ordinary skill in the art will recognize that a refresh command can be embedded into another command by not asserting (as opposed to asserting) the corresponding command/address bit(s) or by asserting/not asserting various combinations of command/address bits, in contrast with the example provided in Table 1 above.

In some embodiments, one or more commands (e.g., a read command (READ) or a write command (WRITE)) can be embedded into a refresh command. For example, a read command (READ) or a write command (WRITE) can be embedded into a refresh single bank command (REFsb). Continuing with this example, a first set of (e.g., one or more) command/address bits of the refresh command can indicate a refresh single bank operation, and a second set of (e.g., one or more) command/address bits of the refresh command can indicate a read or write operation. The first set of command/address bits can be the same or different from the second set of command/address bits. In response to the first set of command/address bits of the refresh command, the memory device 100 proceeds to perform a refresh operation on a memory bank or memory bank group of the memory array 150. Once the memory device or die completes the refresh operation, the memory device or die can open the same memory row(s) again and can proceed to read or write data to the memory array 150. Opening the same memory row(s) again after completion of the refresh operation obviates the need for a memory controller 101 to issue another activate command (ACT) following completion of the refresh operation but before execution of the read or write operation.

Figure 7:
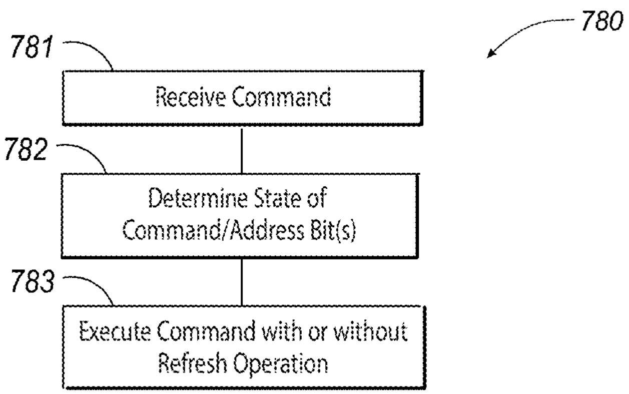
FIG. 7 is a flow diagram illustrating a routine of a memory device and/or a memory system configured in accordance with various embodiments of the present technology.

FIG. 7 is a flow diagram illustrating a routine 780 of a memory device and/or a memory system configured in accordance with various embodiments of the present technology. In some embodiments, the routine 780 can be executed, at least in part, by a memory device, a memory controller operably connected to the memory device, and/or a host device operably connected to the memory controller and/or to the memory device. For example, one or more steps of the routine 780 can be carried out at least in part by components of a memory device, such as a command/address input circuit, a command decoder, a row decoder, a column decoder, a memory array, a memory row, a memory bank, and/or memory bank group. In these and other embodiments, all or a subset of the steps of the routine 780 can be performed by other components of the memory device, by components of the memory controller, by components of the host device, and/or by other components of a memory system containing the memory device.

The routine 780 can begin at block 781 by receiving a command over a command/address bus as a plurality of command/address bits (e.g., as 14 command/address bits or another number of command/address bits). In some embodiments, a first set of the command/address bits can indicate a read operation (Read), a read operation and a precharge operation (Read AP), a write operation (Write), and/or a write operation and a precharge operation (Write AP). In these and other embodiments, the first set of the command/address bits can indicate another operation, such as a precharge operation (Pre) or a mode register operation. In these and still other embodiments, a second set of the command/address bits (e.g., one or more refresh command/address bits) can indicate whether to execute a refresh operation (e.g., a refresh single bank operation, a refresh all banks operation, a fine granular refresh operation, etc.). Each command/address bit of the plurality of command/address bits are either asserted or not asserted.

At block 782, the routine 780 monitors the plurality of command/address bits of the command received over the command/address bus at block 781. For example, the routine 780 can monitor the first set of command/address bits of the command received at block 781 and determine that the first set of command/address bits indicate a read operation (Read). In this embodiment, the routine 780 can proceed to block 783 to execute a read operation. In these and other embodiments, the routine 780 can monitor the second set of command/address bits to determine whether to perform a refresh operation (e.g., in addition to the operation indicated by the first set of command/address bits). For example, the routine 780 can determine whether command/address bits of the second set of command/address bits are asserted or are not asserted. Continuing with this example, the routine 780 can determine not to execute a refresh operation when one or more command/address bits of the second set of command/address bits are not asserted. On the other hand, the routine 780 can determine to execute a refresh operation when one or more command/address bits of the second set of command/address bits are asserted.

At block 783, the routine 780 executes the command received at block 781 with or without a refresh operation depending on the states of the second set of command/address bits monitored at block 782. Continuing with the above example, the routine 780 executes only the read operation (Read) at block 783 when the second set of command/address bits do not indicate that a refresh operation should be executed. On the other hand, the routine 780 executes a refresh operation (e.g., following the read operation) when the second set of command/address bits indicate that a refresh operation should be executed. In some embodiments, the routine 780 executes a precharge operation after executing the operation indicated by the first set of command/address bits but before executing the refresh operation.

Although the steps of the routine 780 are discussed and illustrated in a particular order, the method illustrated by the routine 780 in FIG. 7 is not so limited. In other embodiments, the method can be performed in a different order. In these and other embodiments, any of the steps of the routine 780 can be performed before, during, and/or after any of the other steps of the routine 780. Moreover, a person of ordinary skill in the relevant art will readily recognize that the illustrated method can be altered and still remain within these and other embodiments of the present technology. For example, one or more steps of the routine 780 illustrated in FIG. 7 can be omitted and/or repeated in some embodiments. In these and other embodiments, one or more steps of the routine 780 can be combined to form one or more other routines of the memory device.

Figure 8:
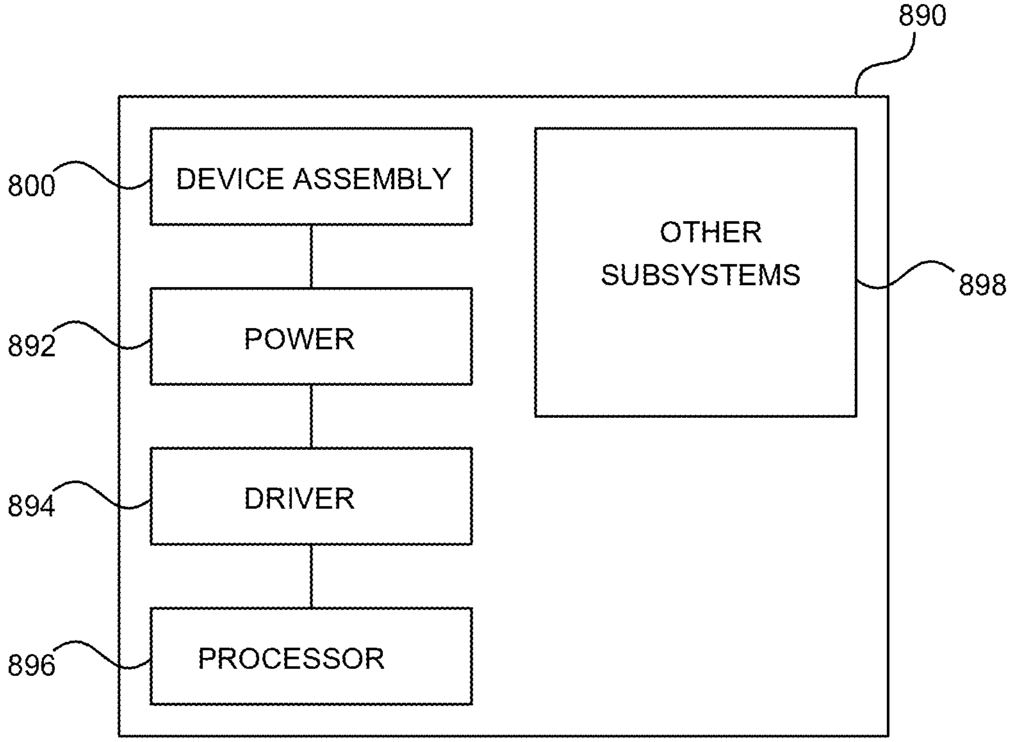
FIG. 8 is a schematic view of a system that includes a memory device configured in accordance with various embodiments of the present technology.

FIG. 8 is a schematic view of a system that includes a memory device in accordance with embodiments of the present technology. Any one of the foregoing memory devices described above with reference to FIGS. 1-7 can be incorporated into any of a myriad of larger and/or more complex systems, a representative example of which is system 890 shown schematically in FIG. 8. The system 890 can include a semiconductor device assembly 800, a power source 892, a driver 894, a processor 896, and/or other subsystems and components 898. The semiconductor device assembly 800 can include features generally similar to those of the memory device described above with reference to FIGS. 1-7, and can, therefore, include various features of memory content authentication. The resulting system 890 can perform any of a wide variety of functions, such as memory storage, data processing, and/or other suitable functions. Accordingly, representative systems 890 can include, without limitation, hand-held devices (e.g., mobile phones, tablets, digital readers, and digital audio players), computers, vehicles, appliances, and other products. Components of the system 890 may be housed in a single unit or distributed over multiple, interconnected units (e.g., through a communications network). The components of the system 890 can also include remote devices and any of a wide variety of computer readable media.

Conclusion

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A method at a memory device, comprising:

receiving, via a plurality of command/address terminals of the memory device, a plurality of bits including a first set of bits to instruct the memory device to perform a first access operation and a second set of bits to instruct the memory device to perform a second access operation, wherein the first set of bits and the second set of bits are received at a same time or in a single communication;

performing the first access operation in response to receiving the first set of bits; and performing the second access operation in response to receiving the second set of bits.

2. The method of claim 1, wherein:

the first access operation is performed on a first portion of a memory array of the memory device, and the second access operation is performed on a second portion of the memory array of the memory device.

3. The method of claim 1, wherein the first access operation comprises a refresh operation, and the second access operation comprises a read with auto precharge operation.

4. The method of claim 1, wherein the first access operation comprises a refresh operation, and the second access operation comprises a read operation.

5. The method of claim 1, wherein the first access operation comprises a refresh operation, and the second access operation comprises a write with auto precharge operation.

6. The method of claim 1, wherein the first access operation comprises a refresh operation, and the second access operation comprises a write operation.

7. The method of claim 1, wherein the first access operation comprises a refresh single bank operation or a refresh all bank operation.

8. A memory device, comprising:

a plurality of command/address terminals; and one or more circuits coupled with the plurality of command/address terminals and configured to cause the memory device to:

receive, via the plurality of command/address terminals of the memory device, a plurality of bits including a first set of bits to instruct the memory device to perform a first access operation and a second set of bits to instruct the memory device to perform a second access operation, wherein the first set of bits and the second set of bits are received at a same time or in a single communication;

perform the first access operation in response to receiving the first set of bits; and perform the second access operation in response to receiving the second set of bits.

9. The memory device of claim 8, wherein:

the first access operation is performed on a first portion of a memory array of the memory device, and the second access operation is performed on a second portion of the memory array of the memory device.

10. The memory device of claim 8, wherein the first access operation comprises a refresh operation, and the second access operation comprises a read with auto precharge operation.

11. The memory device of claim 8, wherein the first access operation comprises a refresh operation, and the second access operation comprises a read operation.

12. The memory device of claim 8, wherein the first access operation comprises a refresh operation, and the second access operation comprises a write with auto precharge operation.

13. The memory device of claim 8, wherein the first access operation comprises a refresh operation, and the second access operation comprises a write operation.

14. The memory device of claim 8, wherein the first access operation comprises a refresh single bank operation or a refresh all bank operation.

15. A memory controller, configured to:

transmit, via a command/address bus to a memory device, a plurality of bits including a first set of bits that instruct the memory device to perform a first access operation and a second set of bits that instruct the memory device to perform a second access operation, wherein the memory controller is configured to transmit the first set of bits and the second set of bits at a same time or in a single communication.

16. The memory controller of claim 15, wherein:

the first access operation is for a first portion of a memory array of the memory device, and the second access operation is for a second portion of the memory array of the memory device.

17. The memory controller of claim 15, wherein the first access operation comprises a refresh operation, and the second access operation comprises a read with auto precharge operation.

18. The memory controller of claim 15, wherein the first access operation comprises a refresh operation, and the second access operation comprises a read operation.

19. The memory controller of claim 15, wherein the first access operation comprises a refresh operation, and the second access operation comprises a write with auto precharge operation.

20. The method of claim 1, wherein the first set of bits identifies the first access operation from among a plurality of different possible first access operations, and the second set of bits identifies the second access operation from among a plurality of different possible second access operations.

* * * * *